US007033941B2

(12) United States Patent
Rooyackers

(10) Patent No.: US 7,033,941 B2
(45) Date of Patent: Apr. 25, 2006

(54) METHOD OF PRODUCING SEMICONDUCTOR DEVICES USING CHEMICAL MECHANICAL POLISHING

(75) Inventor: Rita Rooyackers, Leuven (BE)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 205 days.

(21) Appl. No.: 10/187,382

(22) Filed: Jun. 27, 2002

(65) Prior Publication Data

US 2003/0017705 A1 Jan. 23, 2003

(30) Foreign Application Priority Data

Jun. 29, 2001 (EP) ................................ 01870148

(51) Int. Cl.
*H01L 21/302* (2006.01)

(52) U.S. Cl. ...................................... 438/692; 438/694

(58) Field of Classification Search ................ 438/690, 438/691, 692, 693, 694, 433, 435, 436, 437
See application file for complete search history.

(56) References Cited

U.S. PATENT DOCUMENTS

| | | | | |
|---|---|---|---|---|
| 5,362,669 | A * | 11/1994 | Boyd et al. | 438/437 |
| 5,498,565 | A | 3/1996 | Gocho et al. | |
| 5,726,084 | A | 3/1998 | Boyd et al. | |
| 5,773,871 | A | 6/1998 | Boyd et al. | |
| 5,851,899 | A | 12/1998 | Weigand | |
| 5,968,842 | A | 10/1999 | Hsiao | |
| 6,048,771 | A | 4/2000 | Lin et al. | |
| 6,096,656 | A * | 8/2000 | Matzke et al. | 438/702 |
| 6,114,249 | A * | 9/2000 | Canaperi et al. | 438/692 |
| 6,146,975 | A * | 11/2000 | Kuehne et al. | 438/437 |
| 6,159,822 | A | 12/2000 | Yang et al. | |
| 6,180,489 | B1 * | 1/2001 | Yang et al. | 438/424 |
| 6,214,695 | B1 | 4/2001 | Inoue et al. | |
| 6,261,923 | B1 * | 7/2001 | Kuo et al. | 438/427 |
| 6,265,295 | B1 | 7/2001 | Lin et al. | |
| 6,290,736 | B1 * | 9/2001 | Evans | 51/307 |
| 6,303,956 | B1 * | 10/2001 | Sandhu et al. | 257/306 |

(Continued)

FOREIGN PATENT DOCUMENTS

EP 0 545 263 A2 6/1993

(Continued)

OTHER PUBLICATIONS

Merriam-Webster's collegiate dictionary, tenth edition, p. 811.*

(Continued)

*Primary Examiner*—Kin-Chan Chen
(74) *Attorney, Agent, or Firm*—Knobbe Martens Olson & Bear LLP

(57) ABSTRACT

The present invention is related to a method for producing semiconductor devices from a semiconductor substrate, comprising providing a substrate having on its surface a number of elevated areas separated by areas which are at a lower level. Each elevated area has at its top surface a first layer of a material which is resistant to Chemical Mechanical Polishing (CMP). The method further comprises depositing a layer of a dielectric on top of the whole of said substrate, thereby filling the gaps between said elevated areas. The method further comprises depositing a second layer of a material which is resistant to CMP on top of the whole of said substrate. The method further comprises removing parts of the second CMP resistant layer and of dielectric layer. The method further comprises performing a CMP step and terminating the CMP step at the location of said first and second CMP resistant layers.

26 Claims, 2 Drawing Sheets

U.S. PATENT DOCUMENTS

| | | | | |
|---|---|---|---|---|
| 6,342,432 B1 * | 1/2002 | Wang | ......................... | 438/435 |
| 6,423,628 B1 * | 7/2002 | Li et al. | ..................... | 438/622 |
| 6,528,389 B1 * | 3/2003 | Allman et al. | .............. | 438/424 |
| 6,555,476 B1 * | 4/2003 | Olsen et al. | ................ | 438/692 |

FOREIGN PATENT DOCUMENTS

| | | |
|---|---|---|
| EP | 0 825 645 A1 | 2/1998 |
| EP | 0 926 715 A2 | 6/1999 |
| JP | 11-214496 | 8/1999 |

OTHER PUBLICATIONS

International Search Report for European Application No. 01870148.2, filed Jun. 29, 2001, having a search completion date of Nov. 27, 2001.

Badeness, et al., "A new dummy-free shallow trench isolation concept for mixed-signal applications", Journal of The Electrochemical Society, 147 (10), pp. 3827-3832, (2000).

* cited by examiner

METHOD OF PRODUCING SEMICONDUCTOR DEVICES USING CHEMICAL MECHANICAL POLISHING

FIELD OF THE INVENTION

The present invention is generally related to methods of producing semiconductor devices. More particularly, the invention relates to production techniques and devices obtained by using chemical mechanical polishing (CMP).

DESCRIPTION OF THE RELATED ART

In CMOS processing, electrical isolation of adjacent devices, for example transistors, is crucial. This isolation is commonly obtained in the first stages of the production process by forming a buried dielectric between devices, for which several techniques have been documented. Now that the scaling of semiconductor technologies is being taken into deep submicron dimensions, many of the older methods (such as LOCOS based techniques) are no longer usable. Shallow trench isolation in combination with chemical mechanical polishing (STI-CMP) is accepted as the isolation technique of choice for sub-0.25 μm technologies.

Also in other parts of a complementary metal oxide semiconductor (CMOS) production process, CMP plays an important role. This is the case for example in replacement gate techniques, wherein the polishing of the pre-metal dielectric (PMD) layer on top of dummy gate stacks of the transistors on the device is of great importance.

In all steps requiring CMP, the topology of the surface that is to be polished must be taken into consideration. A very uneven surface will generally cause irregularities in the polishing process. These problems are explained in more detail in the following for the case of STI-CMP.

In STI, a nitride or other CMP resistant layer is deposited onto a semiconductor (in many cases a silicon) wafer, after which shallow trenches are etched into the wafer leaving islands of nitride, which later become locations of active areas (transistors, etc.). The trenches are then filled with oxide, for example by a chemical vapour deposition (CVD) technique, to form dielectric areas, also called 'field regions' in between the active areas. After that, the planarization of the wafer is performed to perfection by a CMP step, in order to acquire optimal gate patterning.

One of the problems is the difficulty of implementing a CMP process with good overall uniformity, without excessive oxide loss in the field regions ('dishing') and without eroding the nitride layer that covers small and especially isolated active areas, which is due to a difference in polish rate between said field regions and said active areas. A solution to this problem is the introduction of 'dummy' active areas, to obtain a more uniform density of nitride-covered areas over the wafer's surface, thus avoiding the dishing phenomenon.

However, in case of mixed-signal technologies, routing of metal connections which are traversing such dummy active areas causes increased capacitive coupling and noise.

The problems encountered when performing CMP are also related to the technique used for the filling of the trenches. The High Density Plasma-CVD (HDP-CVD) technique yields a 'non-conformal' filling layer, which indicates that after filling the trenches, the active areas are covered by volumes of HDP oxide with slanted sides. The cross-section of these volumes that is perpendicular to the wafer is trapezium-shaped for large active areas and triangular-shaped for small active areas. This is true even for very dense regions, i.e. regions where many small active areas are placed very close together. A conformal layer on the other hand, such as obtained by Low Pressure CVD or conventional Plasma Enhanced CVD techniques, covers the whole of the substrate surface, including dense regions with an even layer of near constant thickness.

HDP-CVD is preferred in current STI processing, since it is the method with the best gap filling capability. After trench filling by HDP-CVD, the surface topology is however very uneven, which causes difficulties when applying CMP. More particularly, the small volumes of HDP-oxide with triangular cross section on top of small active areas tend to be polished too quickly in comparison with larger volumes on top of large active areas. This brings about the risk of nitride erosion on top of small active areas and dishing of field regions if polishing times are too long. Reduction of polishing times may solve this problem, but will increase the danger of an insufficient oxide removal on large active areas.

Since the use of dummy structures brought about its own particular difficulties described above, several solutions to these problems have been proposed so far. One of these is described in document EP-A-825645, which is related to a method of filling STI trenches in a semiconductor substrate of an integrated circuit. Active areas and trenches are filled with a HDP oxide layer after which a biased inverse active area mask of all active areas is used in order to remove oxide on top of all active areas, prior to a polishing step. While this may increase uniformity of the surface before polishing and allow reduction of polish time, this method only diminishes the dishing effect, but does not eliminate it. As noted above, a biased inverse active area mask of all active areas is used, which means that even on top of small active areas, a very small amount of oxide is to be removed. It is very difficult to perform correct lithography on such small features, due to reflection effects. Therefore, a correct patterning of the HDP oxide according to this document is nearly impossible.

Another approach is described in 'A new dummy-free shallow trench isolation concept for mixed-signal applications', G. Badenes et al, Journal of The Electrochemical Society, 147 (10) 3827–3832 (2000). According to the method described in this document, a second nitride layer is deposited above the trench filling oxide layer, prior to CMP. This second nitride layer acts as a CMP resistant layer above the large field regions, that way reducing the dishing effect.

In this so-called 'dual-nitride technique', an additional patterning step is done after the deposition of the second nitride layer. The pattern obtained is such that a layer of nitride is left intact only on large field regions. This effectively reduces the dishing effect, but the uneven topology prior to CMP remains a problem. Especially in the case of HDP-oxide as trench filling material, the nitride layers on small active areas are in danger of being attacked by the polishing before all the oxide on larger active areas is removed.

Document U.S. Pat. No. 5,362,669 describes a method for forming a fully planarized trench isolated region in a semiconductor substrate for an integrated circuit. A CMP resistant layer is deposited on top of the dielectric layer which is filling the trenches. The CMP resistant layer in the centre of a wide trench forms an etch stop to prevent dishing. From the figures and the description of this document, it is evident that the trench filling material used is a conforming material. Therefore, this document does not provide a solution to the specific problems related to the use of HDP oxide as a trench filling material.

Document EP-A-926715 proposes silicon carbide as a better CMP resistant layer than silicon nitride. This means less carbide will be removed in a comparable polishing step.

SUMMARY OF THE INVENTION

The present invention provides a process wherein a combination of actions is taken in order to prevent dishing of large field regions and/or excessive polishing on the active areas, during a CMP step.

In addition, the invention provides a new CMP resistant layer which allows a better selectivity of the polishing process.

The process of the invention provides a solution to the specific problem of the HDP oxide deposition on dense structures and/or small isolated active areas.

In one embodiment, the invention provides a method of producing semiconductor devices from a semiconductor substrate, comprising the following steps:

- providing a substrate having on its surface a number of elevated areas separated by areas which are at a lower level, each elevated area having as its top surface a first layer of a material which is resistant to Chemical Mechanical Polishing,
- Depositing a layer of a dielectric on top of the whole of said substrate (1), at least filling up said lower level areas (5) between said elevated areas (5),
- Depositing a second layer (7) of a material which is resistant to CMP on top of the whole of said layer (6) of a dielectric,
- Removing parts (8) of said second CMP resistant layer (7) and of said layer (6) of a dielectric, said parts being situated above elevated areas (2) having a dimension larger than a predefined minimum,
- Performing a CMP step, said CMP being stopped at the location of said first and second CMP resistant layers (4,7).

According to a preferred embodiment, at least one of said elevated areas (2) has a rectangular top surface and said dimension is the width of said rectangular top surface. In one embodiment, said predefined minimum is 1.8 μm.

Preferably, the surface, parallel to the substrate, of said parts (8) that are removed, is not larger than the surface of said elevated areas (2) above which said parts (8) are situated.

According to the method of the invention, said first and/or said second CMP resistant layers (4,7) may be silicon nitride layers. One or both of these layers may alternatively be silicon carbide layers.

According to a preferred embodiment, the forming of said first (4) and/or second layer (7) of CMP resistant material comprises the following steps:

- depositing a layer of $Si_xO_yN_z$ (11),
- performing a thermal anneal, so that after said anneal a CMP resistant layer (14) is formed underneath said $Si_xO_yN_z$ layer.

Said $Si_xO_yN_z$ layer may deposited on top of a Silicon nitride layer, or on top of a silicon carbide layer, or directly on top of said layer of a dielectric material.

Preferably, said thermal anneal takes place at a temperature which is lying between 1050° C. and 1100° C. and during a period of time between 10 minutes and 40 minutes.

Preferably, said $Si_xO_yN_z$ layer has a thickness, before the anneal step, of at least 60 nm.

According to a preferred embodiment of the method of the invention, said dielectric layer (6) is formed by a high density plasma technique.

According to a preferred embodiment of the method of the invention, said elevated areas (2) and said areas (5) at a lower level are created using the technique of Shallow Trench Isolation.

According to another embodiment of the method of the invention, said elevated areas (2) consist of dummy gate stacks in a replacement gate technique.

The invention is equally related to a device obtained by the method according to the invention.

DETAILED DESCRIPTION OF CERTAIN EMBODIMENTS

Figure 1:
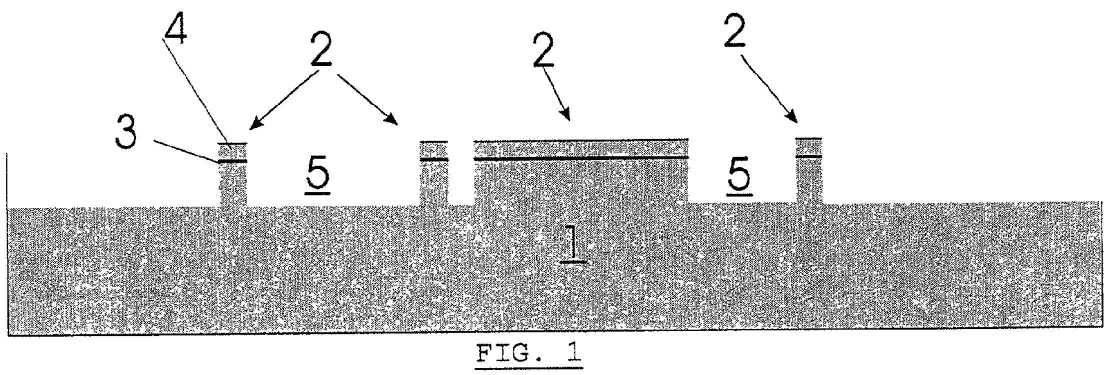
FIG. 1 shows a substrate during a stage in the process according to the invention, prior to the deposition of the trench filling oxide.

The invention provides a method of producing semiconductor devices, starting from a semiconductor substrate, such as a silicon wafer. The method comprises a number of steps up to and including the Chemical Mechanical Polishing step. In one embodiment, the main steps of the method of the invention may be summarized as follows (with reference to FIGS. 1 to 5):

- providing a substrate 1 having on one surface a number of elevated areas 2 separated by areas 5 which are at a lower level, each elevated area 2 having as its top surface a first layer 4 of a material which is resistant to Chemical Mechanical Polishing;
- Depositing a layer 6 of a dielectric on substantially the entire top surface of the substrate 1, in order to fill up at least the lower level areas 5 between said elevated areas 2;
- Depositing a second layer 7 of a material which is resistant to CMP on substantially the entire top surface of the layer 6 of the dielectric;
- Removing parts 8 of said second CMP resistant layer 7 and of said layer 6 of the dielectric, said parts being situated above elevated areas 2 having a dimension larger than a predefined minimum; and
- Performing a CMP step, and stopping said CMP at said first and second CMP resistant layers (4, 7).

The above steps may be performed at different stages of a production process. In particular, the steps are applicable to performing STI-CMP in the beginning of the production process, leading to a good polishing quality when HDP oxide is used as the trench filling oxide. In this embodiment, the elevated areas 2 constitute the active areas, having preferably a nitride layer 4 on their top surface, and the lower level areas 5 constitute the trenches formed by STI.

The step sequence described above may be used in other parts of the CMOS process, even though not all of the advantages relevant to the use of the steps in STI-CMP may be retained. In particular, the method of the invention may be used in the polishing of pre-metal dielectric layers on top of dummy gate stacks, prior to a replacement gate technique. In this embodiment, the elevated areas 2 represent the dummy gate stacks themselves. The lower level areas 5 then include the field regions comprising field oxide and parts of the active areas surrounding the gate stacks. A level difference may exist between the field oxide and the parts surrounding the gate stacks. The 'elevated areas 2' mentioned in the previous method steps refer only to the dummy gate stacks, in this particular embodiment.

In another embodiment, the method of the invention may be restricted to STI-CMP, using HDP oxide as trench filling material, as provided in the following description. FIGS. 1 to 5 illustrate this process. A semiconductor substrate 1, preferably a silicon wafer is provided, upon which a silicon oxide layer 3 and a CMP resistant layer 4, preferably a silicon nitride layer ($Si_3N_4$), are consecutively deposited, after which trenches 5 are patterned (e.g., by a litho and etch step), leaving islands 2, or so-called 'active areas'. FIG. 1 shows the condition after these first steps are performed.

Figure 2:
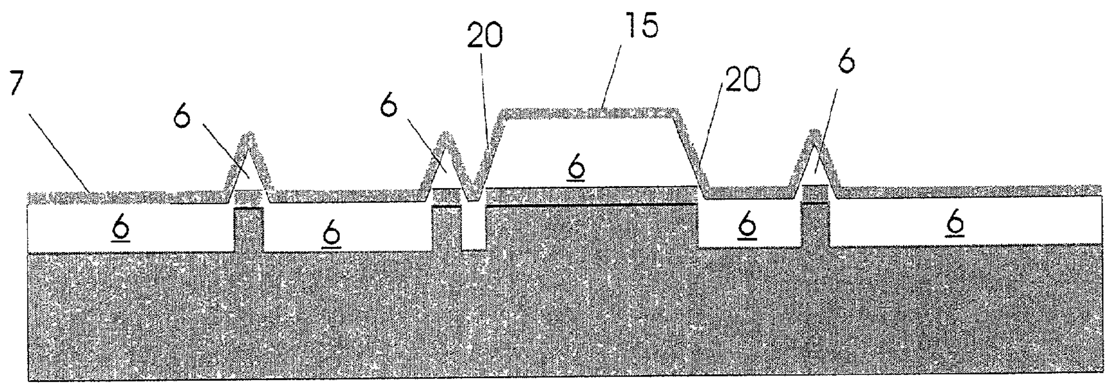
FIG. 2 shows the substrate during a stage in the process according to the invention after the deposition of a second CMP resistant layer.

Subsequently, a layer 6 of HDP oxide is deposited, followed by depositing a second layer 7 of a CMP resistant material on top of layer 6 (see FIG. 2). After depositing layers 6 and 7, a 'clear-out' is done above the large active areas, e.g., by performing a litho step and an etch step to remove part of the second CMP resistant layer 7 and part of the HDP oxide layer 6 in a well defined region 8 above each of said large active areas (see FIG. 3). The minimum size of what is called a 'large' active area is defined on the basis of the process parameters. Using HDP, an oxide body with a flat top 15 and slanted sides 20 is formed on active areas larger than a predefined size, while a triangular-shaped oxide body is formed on anything smaller than the predefined size. This predefined size depends largely on the HDP parameters, in particular on the depostion/etch ratio inherent to the HDP process. According to one embodiment, a flat top 15 is formed on areas with a rectangular top surface having a width larger than 1.2 μm. In the same embodiment, the 'clear-out' is done above active areas with a width larger than 1.8 μm.

The surface area of the region 8 is preferably smaller than the horizontal projection of the entire HDP oxide body on top of the active area concerned, including the slanted edges 20. In the case of HDP oxide, the region 8, as seen in the cross section of FIG. 3, should preferably not extend beyond the edges (designated by numeral 21) of the flat top 15 of the oxide on top of the active area 2. This avoids damaging the edges 21 of the actual active area 2 when the HDP oxide is, at least partially, removed during the 'clear-out' step, by an oxide-etching process. If this oxide-etching process is not selective to the CMP resistant layer 4, this layer 4 will be at least partially etched at the edges of the active area, which will result in a lower CMP stopping power at these edges. If too much oxide is removed at the edges, this also brings about the risk of damaging the active areas during the polishing step.

According to the preferred embodiment, I-line lithography is used for patterning regions 8. In this embodiment, the region 8 is patterned so that its width is approximately 0.6 μm smaller than the width of active areas 2. This lithography step allows the use of a mask derived from the active area mask and is therefore easy to implement and at low cost.

It should be clear from this description to one of ordinary skill in the art that the above mentioned restrictions on size are not limiting to the invention. If other HDP parameters are used and/or a more expensive lithography step, and/or a nitride selective etch step for the 'clear-out', smaller active areas may come into focus for this clear out step. Under these conditions, the region 8 may be chosen to be larger than described above. With respect to the uniformity of the CMP process, described hereinafter, it is however desirable to retain areas 23 at the edges 21 of large active areas.

In this embodiment, it is not necessary to perform further patterning of the second CMP resistant layer 7, beyond the clear-out step.

Figure 3:
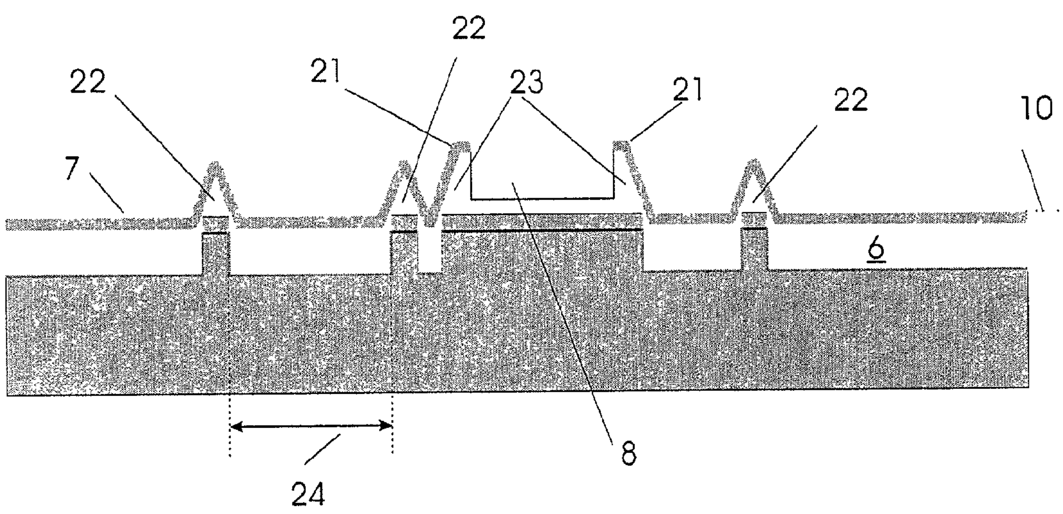
FIG. 3 shows the substrate during a stage in the process according to the invention after the 'clear-out' operation.

The CMP may be performed next, as described hereafter. As seen in FIG. 3, only relatively small volumes 22 and 23 remain above the surface level 10. The volumes 22 above small active areas my have pointed edges at the top. Without the layer 7, volumes 22 would be removed much too quickly by CMP, due to a large local pad pressure on these pointed edges. The layer 7 reduces the polishing speed in such volumes sufficiently to avoid this removal phenomenon. In one embodiment, the volumes 23 at the edges 21 of the active areas are partially covered by the layer 7, which will likewise produce the effect of slowing down the removal of the volumes 23 during CMP. These volumes should be sufficiently small to avoid a significant difference in polishing speed between volumes 22 and 23. On the other hand, as already noted, it is desirable that the volumes 23 have a minimum size in order to ensure protection of the edges of the active areas 2. In most cases, the height of the volumes 23 is higher than that of the volumes 22, due to the specifics of the HDP process (deposition/etch ratio), in conjuction with the size of the active areas. However, the size of all volumes 22 and 23 remaining after the clear-out step, is substantially of the same order of magnitude.

According to the invention, all the volumes (22, 23) protruding above the surface level 10 are polished at a similar reduced polishing speed, due to their similar volume size. All volumes (22, 23) may be at least partially covered by the layer 7, thereby making their resistance to CMP essentially equal in substantially every part.

Moreover, since no patterning of the layer 7 is necessary beyond the clear-out, the layer 7 protects the field regions in their totality (for example region 24 in FIG. 3), and irrespective of their size. This is contrary to the dual nitride technique, wherein only the central parts of large field regions are protected by a CMP resistant layer. Thus, the dishing effect is substantially eliminated by the method of the invention. Furthermore, variations in polish speed between different parts of the substrate are minimized, so that within one given polish duration, all the oxide on the large active areas 2 is efficiently removed. This removal is effectuated without eroding the nitride layer 4 on top of small active areas, and without removal of the field oxide layer 6 in the field regions (trenches).

Figure 4:
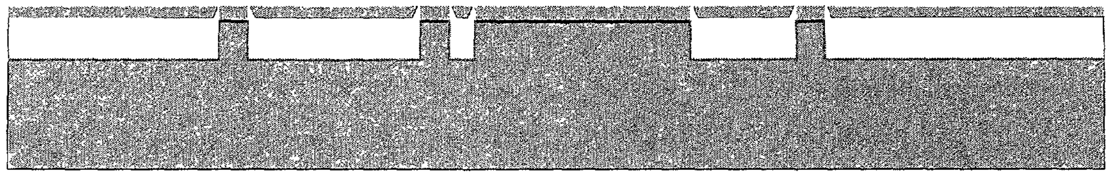
FIG. 4 shows the substrate during a stage in the process according to the invention after the CMP-step.
Figure 5:
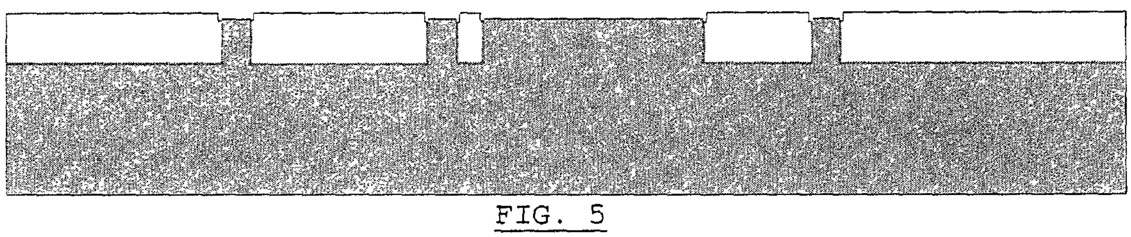
FIG. 5 shows the substrate's surface after removal of first and second CMP resistant layers.

In one embodiment, the polishing step is stopped after reaching the layers 4 and 7. It is desirable to have the top surfaces of the layers 4 and 7 at substantially the same height, and to stop polishing when reaching said same height. Practically, a height difference of a maximum of 30 nm may be allowed. This allowable difference may be eliminated in the last stages of the CMP process, leaving a substantially even surface., In one embodiment, the height difference may reach nearly 0 nm, as shown in FIG. 4. FIG. 5 shows the wafer after removal of the CMP resistant materials.

Several options are proposed according to the present invention, concerning the materials used for the CMP resistant layers. According to one embodiment based on a semiconductor, e.g. a silicon wafer, both layers 4 and 7 may consist of silicon nitride. As a first alternative, two layers of silicon carbide (SiC) are used. One preferred embodiment uses nitride for the first CMP resistant layer 4 and SiC for the second layer 7.

Figure 6:
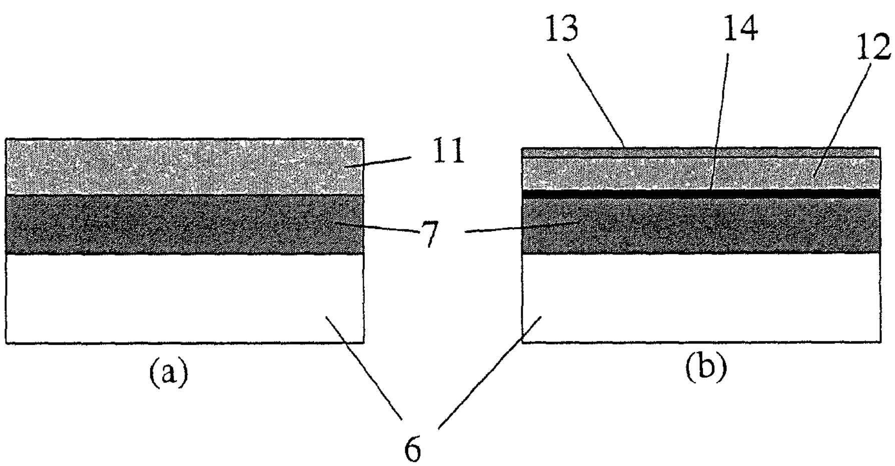
FIGS. 6*a* and 6*b* show the substrate made in accordance with the process of obtaining a CMP resistant layer using silicon-oxy-nitride, according to an embodiment of the invention.

According to another embodiment, the CMP resistant layers may be formed as follows (see FIGS. 6*a* and 6*b*), for example in the case of the second CMP resistant layer 7. In this embodiment, a silicon-oxy-nitride layer ($Si_xO_yN_z$) layer 11 is deposited on top of the layer 7. The relative amounts (x,y,z) of silicon, oxygen and nitrogen in the molecules of this layer 11 may vary within limits, provided that a detectable amount of every one of the components Si, O, N is present in the layer 11. $Si_xO_yN_z$ may be used as an anti-reflective coating on the first CMP resistant layer 4. In one embodiment, another useful aspect of a $Si_xO_yN_z$ layer is provided.

According to a preferred embodiment, the thickness of the layer 11 may be 65 nm, and its compostion is as follows: 52% Si, 5% N, 43% O.

After deposition of the $Si_xO_yN_z$, the wafer is subjected to a thermal anneal, preferably in the range of 1050° C.–1100° C., during a period of time, preferably between 10 and 40 minutes. An anneal step of 27 minutes at 1075° C. causes part of the approximately 65 nm thick $Si_xO_yN_z$ layer to oxidize leaving a $Si_xO_yN_z$ layer 12 of approximately 45 nm, plus on top of that a thin oxide ($SiO_2$) layer 13, approximately 8 nm thick (see FIG. 6*b*). In the contact or interface region between the layer 7 and the $Si_xO_yN_z$ layer 12 however, a chemical reaction may take place during the anneal step, which creates at said interface region a thin layer 14 that is highly resistant to CMP.

According to a preferred embodiment, the layer 14 is formed on top of a silicon nitride layer 7, by the steps described above. The CMP-resistant layer 14 may however be obtained by the same process steps on any other layer besides a nitride layer. It may be obtained directly on the field dielectric 6 by said process steps.

The removal of the thin CMP resistant layer 14 may be accomplished using a dry etching technique. This may be a known dry etching technique normally used for the removal of nitride layers.

Independent of the type of CMP resistant materials used for both the layers 4 and 7, it is desirable to control and keep the difference in height between the field-protecting layers and the active area-protecting layers within given limits, as noted above. In one embodiment, the thickness of the second CMP resistant layer 7 is adapted to the thickness of the first layer 4 and of the trench filling oxide, so that the difference in height between the top of layers 4 and 7 does not exceed 30 nm. In case of a $Si_xO_yN_z$ layer treated by the steps described above, it is desirable to keep the height difference between the top of CMP resistant layers 4 and 14 within these limits (preferably also between 0 and 30 nm).

According to one embodiment of the invention, the sequence of production steps using a SiC layer as the second CMP resistant layer 7 is provided below. The production steps allow obtaining the surface as depicted in FIG. 5, starting from a flat substrate.

1. providing a Silicon wafer;
2. depositing a thin thermal oxide layer, e.g., about 15 nm thick;
3. depositing about 100 nm of $Si_3N_4$, to produce the first CMP resistant layer 4;
4. depositing and patterning a resist layer on top of what will later become the active areas 2;

5. etching the trenches 5 adjacent to the active area regions. Total removed layer thickness may be approximately 515 nm=100 nm $Si_3N_4$+15 nm $SiO_2$+400 nm Si.
6. resist strip;
7. HF-dip for rounding the side walls of the trenches
8. Depositing side wall oxide with a thickness of about 20 nm;
9. Depositing trench filling oxide layer 6 by HDP process: thickness is about 450 nm;
10. Depositing about 50 nm of SiC on top of HDP oxide layer, to produce second CMP resistant layer 7;
11. Depositing and patterning resist on the substantially entire surface, except for region above the large active areas (regions 8);
12. Performing a dry etch to remove about 50 nm of SiC and about 250 nm of HDP oxide on said large active areas, leaving 'clear-out' regions 8;
13. resist strip
14. Depositing about 50 nm of DXZ oxide;
15. Performing CMP until reaching the SiC layer 7 on top of the field regions and the $Si_3N_4$ layers 4 on top of the active areas.
16. Dry-etching to remove SiC layer 7 on field regions and $Si_3N_4$ layer 4 on active areas; and
17. resist strip In yet another embodiment, performing STI-CMP uses a $Si_xO_yN_z$ layer and thermal treatment to obtain the second CMP resistant layer 7. The method of this embodiment comprises substantially the same steps 1 through 9 of the previous embodiment. Following step 9, the method of this embodiment comprises the steps of:

10. depositing about 50 nm of $Si_3N_4$ (layer 7) on top of the HDP oxide layer;
11. depositing 65 nm of $Si_xO_yN_z$ (layer 11) on top of the $Si_3N_4$ layer;
12. performing thermal treatment at about 1075° C. to form a layer of about 45 nm $Si_xO_yN_z$ and on top of that a layer of 8 nm of silicon oxide, both layers being situated on top of the $Si_3N_4$ layer, and a CMP resistant layer 14 at the interface between $Si_3N_4$ and $Si_xO_yN_z$;
13. depositing and patterning resist on substantially the entire surface, except for region above the large active areas;
14. Performing a dry etch to remove about 50 nm of $Si_xO_yN_z$, 50 nm of $Si_3N_4$, and about 250 nm of HDP oxide on said large field regions, leaving 'clear-out' regions 8;
15. resist strip;
16. Depositing about 50 nm of DXZ oxide
17. Performing CMP until reaching the CMP resistant layer 14 on the interface between $Si_3N_4$ and $Si_xO_yN_z$, and the $Si_3N_4$ layer 4 on the active areas;
18. Dry-etching to remove CMP resistant layer 14, nitride layer 7 underneath said CMP resistant layer 14, and nitride layer 4 on top of active areas; and
19. resist strip.

In view of the foregoing, it will be appreciated that the invention overcomes the long-standing need for a method of producing semiconductor devices in accordance with the invention. The invention may be embodied in other specific forms without departing from its scope or essential characteristics. The above described embodiments are to be considered in all respects only as illustrative and not restrictive. More particularly, all numeric values, e.g., for layer thicknesses and temperatures noted above, are non-restrictive to the scope of the invention. Further, any known process step may be performed before, during, or after the above-sequences, and still obtain semiconductor devices, which fall within the scope of the invention. The scope of the invention is, therefore, indicated by the appended claims rather than by the foregoing description. All changes which come within the meaning and range of equivalency of claims are to be embraced within their scope.

The invention claimed is:

1. A method of producing semiconductor devices from a semiconductor substrate, comprising:

depositing a dielectric layer on top of a substrate having a plurality of areas elevated from a reference level, the plurality of elevated areas being separated by areas lower than the reference level, and each of the plurality of elevated areas having a first layer of material resistant to chemical mechanical polishing (CMP), wherein said depositing fills up at least said lower areas;

depositing a second layer of a material resistant to CMP on top of the said dielectric layer;

removing at least a portion of said second layer and a portion of said dielectric layer from respective areas situated above the elevated areas so as to form a trench on the dielectric layer, wherein upon such removal said second layer partly overlaps each elevated area; and performing, CMP wherein the CMP is terminated upon reaching the location of said first and second CMP resistant layers, wherein the portions of the second layer and the dielectric layer are removed before the CMP.

2. The method according to claim 1, wherein the removed portion comprises a surface that is parallel to the substrate and is not larger than the surface of plurality of elevated areas.

3. The method according to claim 1, wherein said first and/or said second layers comprise silicon nitride.

4. The method according to claim 1, wherein said first and/or said second layers comprise silicon carbide.

5. The method according to claim 1, wherein depositing said second layer comprises:

depositing a layer of $Si_xO_yN_z$; and performing a thermal anneal to produce a CMP resistant layer underneath said $Si_xO_yN_z$ layer.

6. The method according to claim 5, further comprising forming a Silicon Nitride layer and wherein said $Si_xO_yN_z$ layer is deposited on top of said Silicon Nitride layer.

7. The method according to claim 5, further comprising forming a Silicon Carbide layer and wherein said $Si_xO_yN_z$ layer is deposited on top of said Silicon Carbide layer.

8. The method according to claim 5, wherein said $Si_xO_yN_z$ layer is deposited on said dielectric layer.

9. The method according to claim 5, wherein said thermal anneal takes place at a temperature in the range of 1050° C.–1100° C. for a duration ranging between 10 minutes and 40 minutes.

10. The method according to claim 5, wherein said $Si_xO_yN_z$ layer has a thickness, before performing the thermal anneal, of at least 60 nm.

11. The method according to claim 1, wherein said dielectric layer is formed using a high density plasma technique.

12. The method according to claim 1, wherein said elevated areas and said lower areas are created using the technique of Shallow Trench Isolation.

13. The method according to claim 1, wherein said elevated areas comprise dummy gate stacks in a replacement gate technique.

14. A method of manufacturing a semiconductor device, the method comprising:

depositing a first layer comprising a material resistant to chemical mechanical polishing (CMP) onto at least one elevated region of a substrate;

filling up at least one unelevated region of the substrate with a layer comprising a dielectric material;

depositing a second layer comprising CMP resistant material onto at least the dielectric material layer;

subjecting the substrate to thermal anneal; and forming a third layer in region of contact between the second CMP resistant layer and the dielectric layer, wherein said third layer comprises material that is more resistant to CMP than the second CMP resistant layer, and wherein said third layer is formed between a $Si_xN_z$ layer and a $Si_xO_yN_z$ layer.

15. The method according to claim 14, further comprising performing a CMP step until reaching the third layer.

16. The method according to claim 15, further comprising removing at least a portion of the third layer.

17. The method according to claim 14, wherein subjecting the substrate to thermal anneal includes chemically reacting the $Si_xN_z$ layer with the $Si_xO_yN_z$ layer to produce the third layer.

18. The method according to claim 14, wherein each of the first and second layers comprises $Si_xO_yN_z$.

19. The method according to claim 14, wherein the dielectric material layer is formed using a high density plasma technique.

20. The method according to claim 14, wherein the subjecting the substrate comprises treating the substrate thermally at a temperature in the range of 1050° C.–1100° C.

21. The method according to claim 14, further comprising performing a dry etch to remove at least a part of the second layer.

22. The method according to claim 14, further comprising performing CMP.

23. A method of producing semiconductor devices from a semiconductor substrate, comprising:

depositing a dielectric layer on top of a substrate having a plurality of areas elevated from a reference level, the plurality of elevated areas being separated by areas lower than the reference level, and each of the plurality of elevated areas having a first layer of material resistant to chemical mechanical polishing (CMP), wherein said depositing fills up at least said lower areas;

depositing a second layer of a material resistant to CMP on top of the said dielectric layer;

removing at least a portion of said second layer and a portion of said dielectric layer from respective areas situated above the elevated areas so as to form a trench on the dielectric layer; and performing CMP;

terminating the CMP upon reaching the location of said first and second CMP resistant layers, wherein the portions of the second layer and the dielectric layer are removed before the CMP; and wherein the trench is formed only above elevated areas having a certain dimension.

24. The method according to claim 23, wherein at least one of the plurality of elevated areas includes a rectangular top surface and wherein said dimension represents the width of said rectangular top surface.

25. The method according to claim 24, wherein the removed portion has a dimension larger than about 1.8 μm.

26. The method of claim 23, wherein the removing comprises etching.

* * * * *